United States Patent
Kim et al.

(10) Patent No.: US 11,742,871 B2
(45) Date of Patent: Aug. 29, 2023

(54) LOW POWER MODULATOR WITH VCO QUANTIZER

(71) Applicant: UNIST (ULSAN NATIONAL INSTITUTE OF SCIENCE AND TECHNOLOGY), Ulsan (KR)

(72) Inventors: Seong Jin Kim, Ulsan (KR); Jee Ho Park, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 42 days.

(21) Appl. No.: 17/531,016

(22) Filed: Nov. 19, 2021

(65) Prior Publication Data

US 2022/0166441 A1   May 26, 2022

(30) Foreign Application Priority Data

Nov. 20, 2020   (KR) .......................... 10-2020-0156555

(51) Int. Cl.
*H03M 1/12* (2006.01)
*H03H 17/02* (2006.01)

(52) U.S. Cl.
CPC .......... *H03M 1/1245* (2013.01); *H03H 17/02* (2013.01)

(58) Field of Classification Search
CPC .................................................. H03M 1/1245
USPC .......................... 341/143, 155, 118, 120, 144
See application file for complete search history.

(56) References Cited

U.S. PATENT DOCUMENTS

| | | | |
|---|---|---|---|
| 10,924,128 B2 * | 2/2021 | Shibata | ............... H03M 1/1033 |
| 11,245,410 B1 * | 2/2022 | Dalla Longa | ......... H03M 1/066 |
| 2013/0187803 A1 * | 7/2013 | Kaald | ..................... H03M 3/37 341/143 |

FOREIGN PATENT DOCUMENTS

| KR | 10-0789907 B1 | 1/2008 |
|---|---|---|
| KR | 10-1982209 B1 | 5/2019 |
| KR | 10-2021947 B1 | 9/2019 |

OTHER PUBLICATIONS

An Office Action mailed by the Korean Intellectual Property Office dated Aug. 17, 2022, which corresponds to Korean Patent Application No. 10-2020-0156555 and is related to U.S. Appl. No. 17/531,016.

An Office Action; "Notice of Final Rejection", mailed by the Korean Intellectual Property Office dated Feb. 6, 2023, which corresponds to Korean Patent Application No. 10-2020-0156555 and is related to U.S. Appl. No. 17/531,016.

* cited by examiner

*Primary Examiner* — Peguy Jean Pierre (74) *Attorney, Agent, or Firm* — Studebaker & Brackett PC (57) ABSTRACT

Disclosed is a low power modulator with a VCO quantizer. The low power modulator with the VCO quantizer may include an integrator converting an input current to a voltage, a quantizer converting the converted voltage to digital information, a filter unit filtering the converted digital information, a DAC converting the filtered digital information into a feedback current, and a controller calculating the digital information output based on a difference value between the input current and the feedback current for each sampling time.

9 Claims, 7 Drawing Sheets

DC input

FIG. 5B

AC input

LOW POWER MODULATOR WITH VCO QUANTIZER

CROSS-REFERENCE TO RELATED APPLICATIONS

This application claims the priority of Korean Patent Application No. 10-2020-0156555 filed on Nov. 20, 2020, in the Korean Intellectual Property Office, the disclosure of which is incorporated herein by reference.

BACKGROUND OF THE INVENTION

Field of the Invention

The present disclosure relates to a low power modulator, and more particularly, to a low power modulator with a VCO quantizer.

Description of the Related Art

As the bioindustry has been developed, biotechnologists have developed a variety of methods for distinguishing the characteristics of microcytes. One of the methods is a 'Bioluminescence', which is a method of measuring the reaction of cells or biopolymer materials by seeding a catalyst capable of distinguishing biological characteristics with light in cells or causing mutation of the cells themselves to emit light so as to allow the cells themselves to emit fluorescent light.

In the related art, in order to measure such light, the fluorescence light is collected using optical techniques to perform observations using a microscope. However, such an optical method is very expensive and requires a large microscope, and it is difficult to observe what happens in the vivo.

To solve the problem, biosensors for measuring currents of photodiodes have been developed. However, since the amount of light emitted from the biomaterials is slight and the amount of a current responding with the photodiodes is also very slight (pA to nA level) unless light is optically collected, these biosensors has one problem to be solved to read the fine current value.

Further, since an optical processing is not performing at all, the photodiode does not generate the current only by a light signal emitted from the biomaterial, but generates the current even by a different wavelength of light, that is, external light, and at this time, the current amount is almost 10 times to 1000 times larger than the current amount generated by the light emitted from the biomaterial.

That is, there was a technical problem to measure only a desired signal by distinguishing a current by external light having a large size and a long change period generated by the photodiode from a current generated by a light signal having a small size and a short change period.

The above-described technical configuration is the background art for helping in the understanding of the present invention, and does not mean a conventional technology widely known in the art to which the present invention pertains.

SUMMARY

The present disclosure is conceived to solve the problems described above, and an object of the present disclosure is to provide a low power modulator with a VOC quantizer.

Another object of the present disclosure is to provide a low power modulator with a VOC quantizer by accumulating a difference value between an input current and a feedback current in an integrator to calculate digital information and calculate a value smaller than a minimum input value which may be originally converted by the quantizer.

Other objects of the present disclosure are not limited to the objects described above, and other objects, which are not mentioned above, will be apparent to those skilled in the art from the following description.

According to an aspect of the present disclosure, there is provided a low power modulator with a VCO quantizer including an integrator converting an input current to a voltage, a quantizer converting the converted voltage to digital information, a filter unit filtering the converted digital information, a DAC converting the filtered digital information into a feedback current, and a controller calculating the digital information output based on a difference value between the input current and the feedback current for each sampling time.

The low power modulator with the VCO quantizer may further include a PWM configured to adjust a bit of the DAC to 1 bit.

The integrator may output a feedback voltage that accumulates the difference value between the input current and the feedback current.

The quantizer may output digital information corresponding to the feedback voltage.

The feedback voltage may be increased or decreased for each sampling time.

The controller may calculate an average value of the digital information corresponding to the feedback voltage for each sampling time.

The threshold value may be determined based on a voltage readable by the quantizer.

The difference value between the input current and the feedback current may be accumulated in the integrator for each sampling time, and the integrator may output a feedback voltage corresponding to the accumulated feedback current.

The filter unit may filter a low frequency bandwidth of the digital information.

Specific matters for achieving the above objects will be clarified with reference to embodiments to be described below in detail with the accompanying drawings.

However, the present disclosure is not limited to embodiments described below, but may be configured in various different forms, and will be provided to complete the disclosure and the present disclosure and to completely inform the scope of the present disclosure to a person with ordinary skill in the art to which the inventions pertains (hereinafter, "those skilled in the art").

According to an embodiment of the present disclosure, the low power modulator can be applied to measure an electrical signal as well as a fluorescent signal using a photodiode to measure all wide input currents and can be used in various field due to a wide application range up to measurement of power consumption of a low power system and measurement of electrical characteristics of a low power device.

The effects of the present disclosure are not limited to the aforementioned effects, and provisional effects to be expected by the technical features of the present disclosure will be clearly understood from the following description.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The present disclosure may have various modifications and various embodiments and specific embodiments will be illustrated in the drawings and described in detail.

Various features of the present disclosure disclosed in claims will be better understood in consideration of the drawings and the detailed description. Apparatuses, methods, preparations and various embodiments disclosed herein will be provided for illustrative purposes. The disclosed structural and functional features are intended to specifically implement various embodiments by those skilled in the art, and are not intended to limit the scope of the present disclosure. Disclosed terms and sentences are for ease of description to understand various features of the disclosed invention, and are not intended to limit the scope of the present disclosure.

In describing the present disclosure, if it is determined that a detailed description of related known technologies unnecessarily makes the gist of the present disclosure unclear, the detailed description will be described.

Hereinafter, a low power modulator with a VCO quantizer according to an embodiment of the present disclosure will be described.

Figure 1:
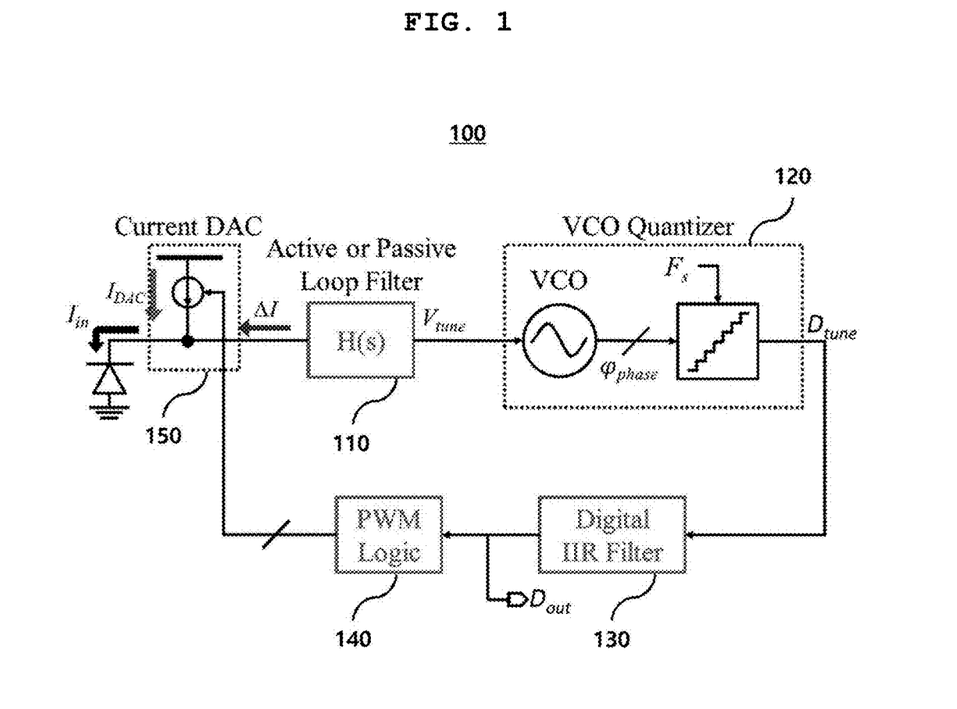
FIG. 1 is a diagram illustrating a low power modulator with a VCO quantizer according to an embodiment of the present disclosure.

FIG. 1 is a diagram illustrating a low power modulator 100 with a VCO quantizer according to an embodiment of the present disclosure.

Referring to FIG. 1, the low power modulator 100 may include an integrator 110, a quantizer 120, a filter unit 130, a pulse width modulation (PWM) 140, a digital-to-analog converter (DAC) 150, and a controller (not illustrated).

The integrator 110 may convert an input current to a voltage.

In an embodiment, the integrator 110 may accumulate the input current in a capacitor included in the integrator 110 when the input current is input to amplify the accumulated input current to the voltage according to a value of the capacitor.

At this time, since the integrator 110 maintains constantly a voltage of an input node according to a negative feedback characteristic of an Op-Amp included in the integrator 110, when connecting a diode, a cathode voltage does not swing, and thus a reverse biased voltage applied to a photodiode is maintained at the same voltage, thereby constantly maintaining an amplification rate of the photodiode itself.

In one embodiment, even when the integrator 110 does not include the Op-Amp, the integrator 110 may constantly maintain the voltage of the input node by preventing the voltage of the input node from greatly swinging by the negative feedback through the filter unit 130, the PWM 140, and the DAC 150.

However, when the Op-AMP of the integrator 110 is used, the effect thereof is further increased, and when there is the Op-Amp, the input voltage swings within 1 mV, but even when there is no Op-Amp, the input voltage swings only in about several mV according to a current value to maintain a diode cathode voltage.

The quantizer 120 may convert the converted voltage to digital information.

In one embodiment, the voltage based on the input current may be input to the quantizer 120 to change the frequency of an oscillator included in the quantizer 120. In one embodiment, the quantizer 120 may include a voltage-controlled oscillator (VCO).

In one embodiment, the VCO serves as a quantizer that converts the voltage to a digital value, and senses a phase change rate of the oscillator by observing a difference in frequency changed for a certain time (sampling period) to quantize the voltage input to the VCO to a digital value.

The filter unit 130 may filter the converted digital information. In one embodiment, the filter unit 130 may filter a low frequency bandwidth of the digital information.

For example, the filter unit 130 may be implemented as a digital IIR filter. In one embodiment, the filter unit 130 may include a digital filter 132, and for example, the digital filter 132 may include a digital low pass filter.

Then, in the digital information (e.g., digital code), digital information of a path through the digital filter 132 by two paths of the filter unit 130 determines a low frequency component input as the input and the digital information through the remaining path may be converted to a feedback current through the DAC 150 by passing through a high frequency component.

That is, a current having a large amplitude of the low frequency input to an input end is removed by the digital information with only the low frequency remaining through the digital filter 132, and the digital information including the remaining high frequency component is a frequency component of a required signal to output a current signal to digital information through the DSM via a path which does not pass through the digital filter 132.

The DAC 150 may convert the filtered digital information into a feedback current.

The controller may calculate the digital information output based on a difference value between the input current and the feedback current for each sampling time.

In one embodiment, the PWM 140 may adjust a bit of the DAC 150 to 1 bit.

In one embodiment, the integrator 110 may output a feedback voltage that accumulates the difference value between the input current and the feedback current for each sampling time.

In one embodiment, the quantizer 120 may output digital information corresponding to the feedback voltage. In one embodiment, a threshold value may be determined based on a voltage readable by the quantizer 120.

In one embodiment, the feedback voltage may be increased or decreased for each sampling time.

In one embodiment, the difference value between the input current and the feedback current may be accumulated in the integrator 110 for each sampling time. In this case, the integrator 110 may output a feedback voltage corresponding to the accumulated feedback current.

In one embodiment, the controller may calculate an average value of the digital information corresponding to the feedback voltage for each sampling time.

In one embodiment, in the input node, the feedback current and the input current of the DAC 150 are offset to each other, and may be accumulated in the first integrator 110 by an original difference between the input current and the feedback current.

When continuously repeating the process, the difference between the input current and the feedback current is continuously accumulated, and when the quantizer 120 can determine the difference, the code of the DAC 150 is further increased by 1 and the feedback current of the DAC 150 is increased, so that the differences accumulated in the integrator 110 may be reduced.

When the determination of the quantizer 120 is performed faster than a change rate of the input current and how many times the accumulated differences are repeated to be removed is calculated through an average by collecting the digital information, it can be seen that the value may be a smaller value than a minimum input value capable of being originally converted by the quantizer 120.

In one embodiment, the controller may include at least one processor or micro processor, or apart of the processor. In addition, the controller may be referred to as a communication processor (CP). The controller may control an operation of the low power modulator 100 according to various embodiments of the present disclosure.

Referring to FIG. 1, the low power modulator 100 may include an integrator 110, a quantizer 120, a filter unit 130, a PWM 140, a DAC 150, and a controller. In various embodiments of the present disclosure, since the components described in FIG. 1 are not required, the low power modulator 100 may be implemented to have more components or fewer components than the components described in FIG. 1.

In one embodiment, the low power modulator 100 according to the present disclosure may include a delta-delta delta-sigma modulator (DSM) system for converting a broadband current signal to a digital value with low power.

Figure 2:
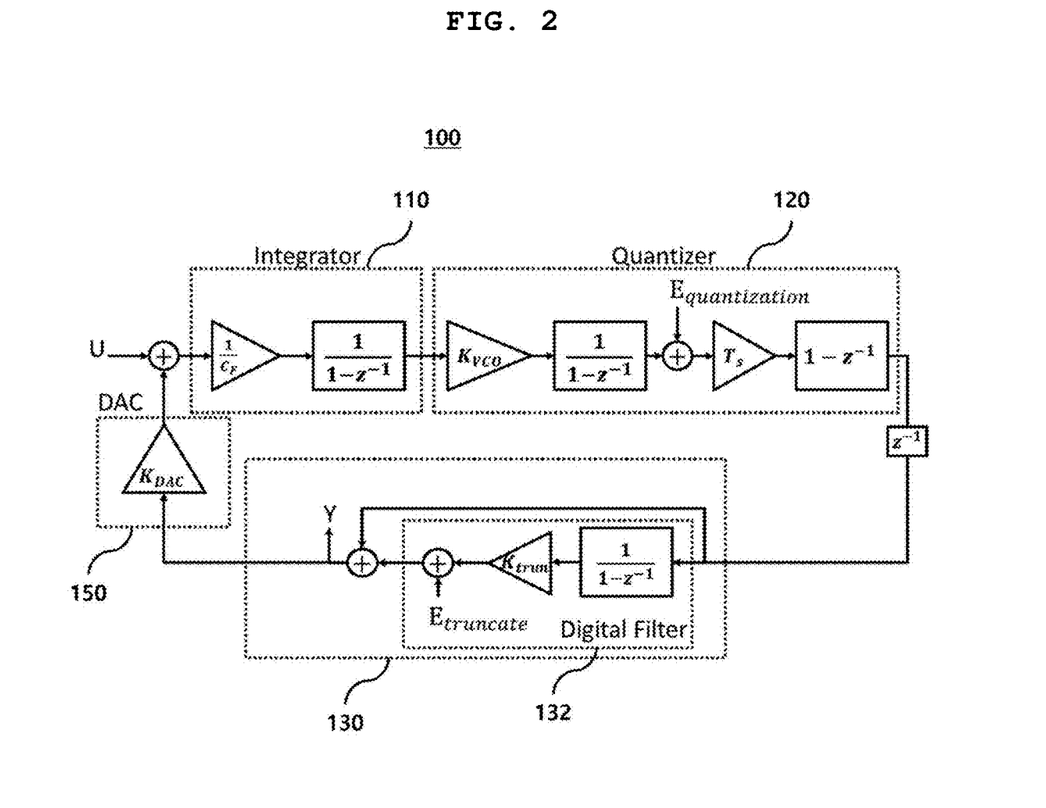
FIG. 2 is a diagram illustrating a mathematical model of a low power modulator with a VCO quantizer according to an embodiment of the present disclosure.
Figure 3:
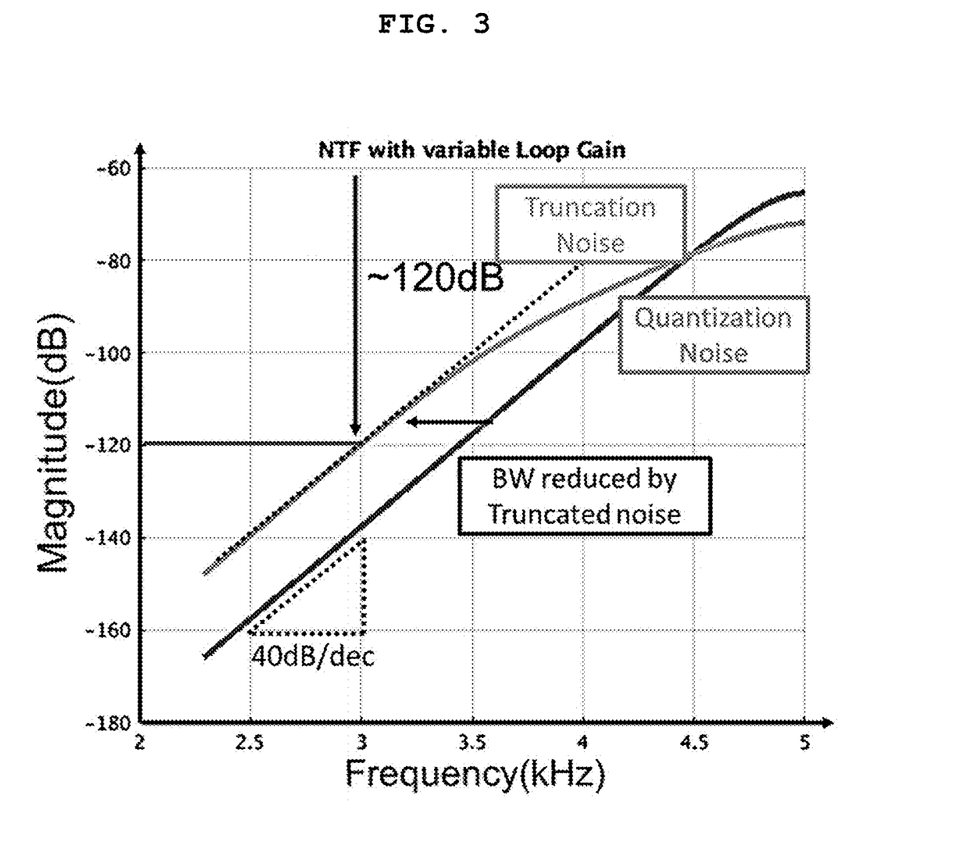
FIG. 3 is a diagram showing a performance graph of the low power modulator with the VCO quantizer according to an embodiment of the present disclosure.

FIG. 2 is a diagram illustrating a mathematical model of the low power modulator with the VCO quantizer according to an embodiment of the present disclosure. FIG. 3 is a diagram showing a performance graph of the low power modulator with the VCO quantizer according to an embodiment of the present disclosure.

Referring to FIG. 2, an error source for the low power modulator 100 may include a quantization error and a truncate error. The two errors are all 2nd order noise shaped to reduce the size of an error in a frequency domain of an interested signal.

In one embodiment, a noise transfer function (NTF) for the low power modulator 100 may be represented by the following Equations 1 and 2.

$$NTF_Q = \frac{(a-z^{-1})(1-z^{-1})^2}{D(Z)} \quad \text{[Equation 1]}$$

Here, $NTF_Q$ represents a quantization error. Here, a and D(Z) may be represented by the following Equation 3.

$$NTF_T = \frac{k_a k_{VCO} k_{DAC}(1-z^{-1})^2}{D(Z)} \quad \text{[Equation 2]}$$

Here, $NTF_T$ represents a truncate error, $K_a$ may represent a $1/C_F = 10^{11}$, $K_{VCO}$ represents $10^5$, and $K_{DAC}$ may represent $32 \times 3 \times 10^{-8}$.

$$D(Z) = (a-z^{-1})k_a k_{VCO} k_{DAC} z^{-2} + (1-z^{-1})^2$$

$$a = 1 + k_{truc} \quad \text{[Equation 3]}$$

Here, $K_a$ may represent $1/C_F = 10^{11}$, $K_{VCO}$ represents $10^5$, $K_{DAC}$ may represent $32 \times 3 \times 10^{-8}$, and $K_{truc}$ may represent ¼.

First, the low power modulator 100 according to the present disclosure makes a DC feedback loop of offsetting a large current of a low frequency by external light by the filter unit 130 (that is, the digital filter) and the feedback DAC 150 to make a magnitude of the input current small and is applied to a DSM capable of measuring a wide input current to widen the input current range more than when using only the DSM and reduce a required sampling frequency, thereby reducing power consumption.

Second, since the feedback DAC and the DC feedback of the DSM have the same input and output, the filter unit 130 is corrected as the following Equation 4 to combine two feedback paths to one, thereby reducing the system complexity.

$$\text{Filter} = \frac{a-z^{-1}}{1-z^{-1}} \quad \text{[Equation 4]}$$

Third, the DAC 150 is implemented to limit the bit number of the DAC 150 to 1 using the PWM 140 to minimize a noise effect of the DAC 150, thereby improving the performance.

Through the three methods, the required sampling frequency is lowered and the performance of the circuit of the lower power modulator 100 is optimized to implement a system having a function of converting an input current of a broadband (100 dB or more) to a digital value with low power consumption.

Referring to FIG. 3, that is, minimum recognizable signal power may be confirmed through Equations 1 to 3 above.

The lower power modulator 100 according to the present disclosure may convert a smaller value than the signal size, and as a result, it can be confirmed that the lower power modulator 100 may convert all inputs of about 120 dB, that is, $1_{pA}$ to $1_{uA}$.

Here, as a result of simulation by adding noise emitted from the circuit of the lower power modulator 100, it can be seen that AC inputs of about 100 dB ($10_{pA}$ to $1_{uA}$) reduced by about 20 dB can be converted.

Figure 4A:
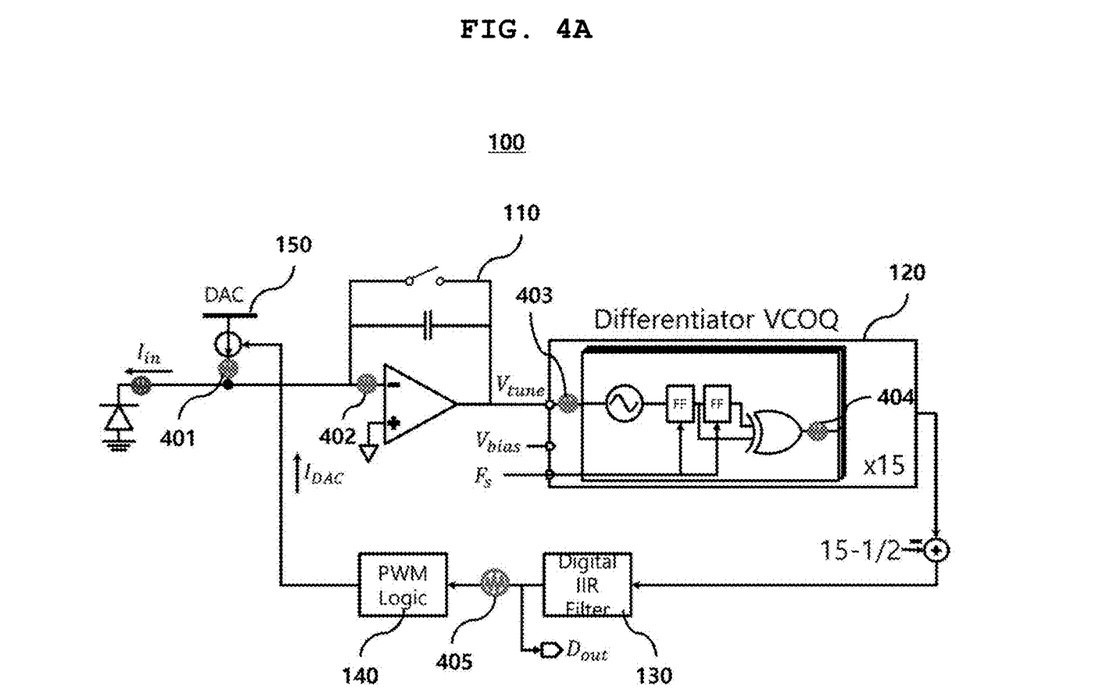
FIGS. 4A and 4B are diagrams illustrating a noise simulation model of the low power modulator with the VCO quantizer according to an embodiment of the present disclosure.
Figure 4B:
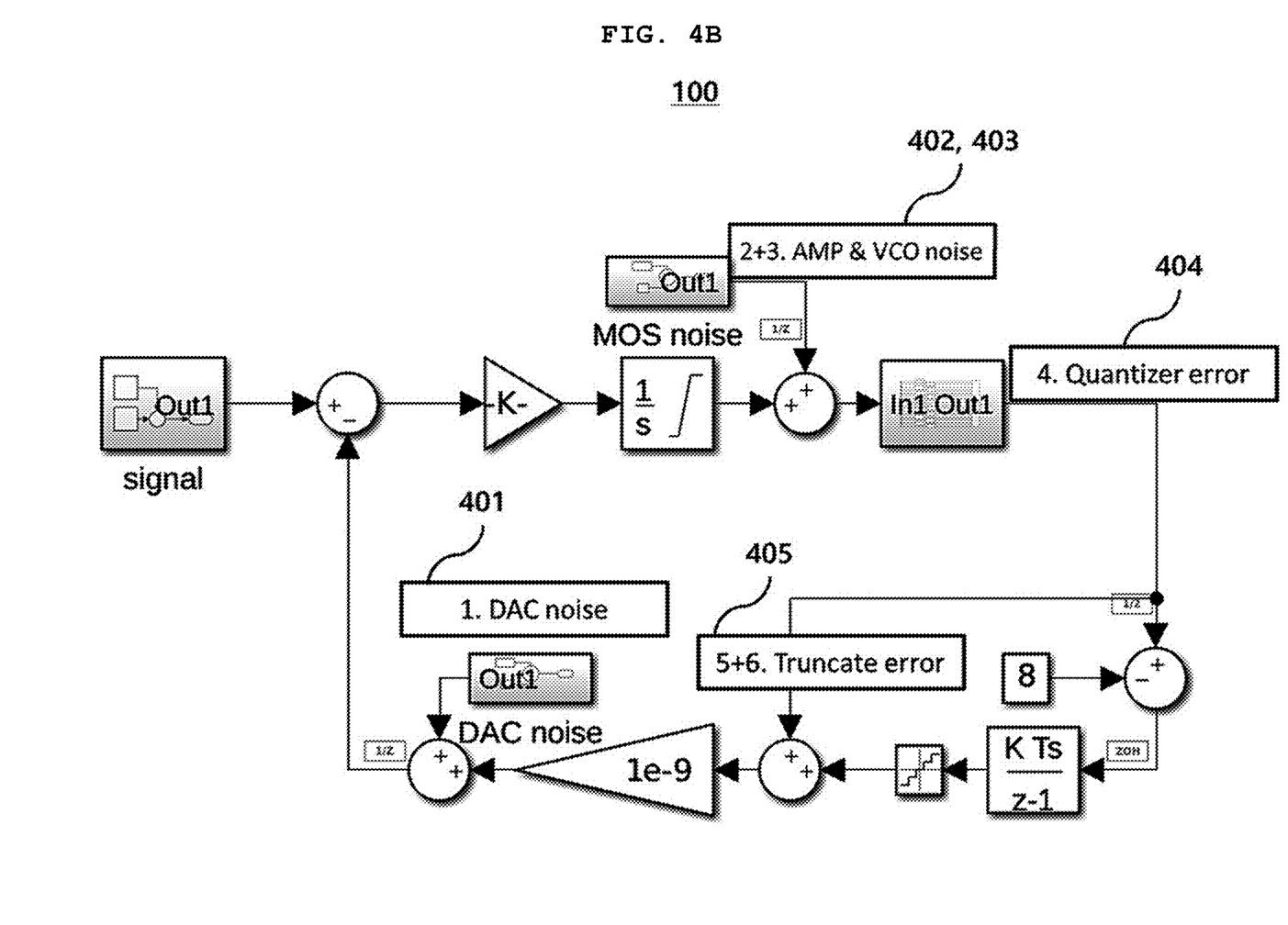
Figure 5A:
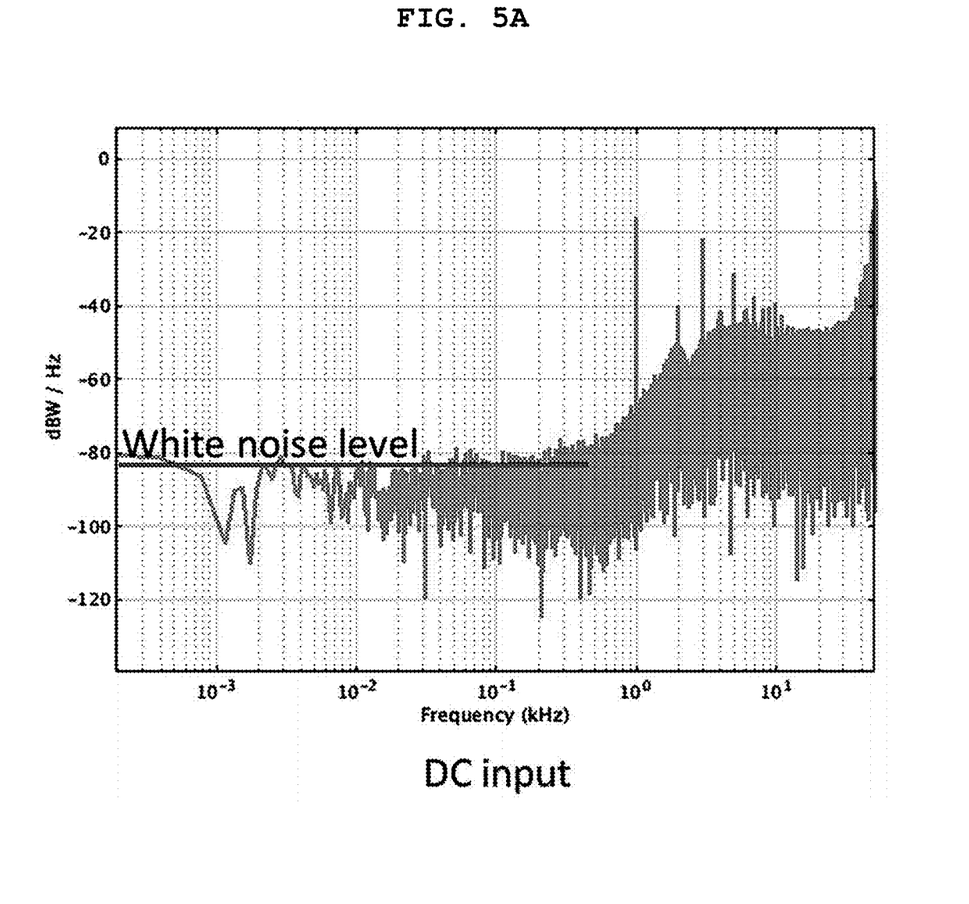
FIGS. 5A and 5B are diagrams showing a noise performance graph of the low power modulator with the VCO quantizer according to an embodiment of the present disclosure.
Figure 5B:
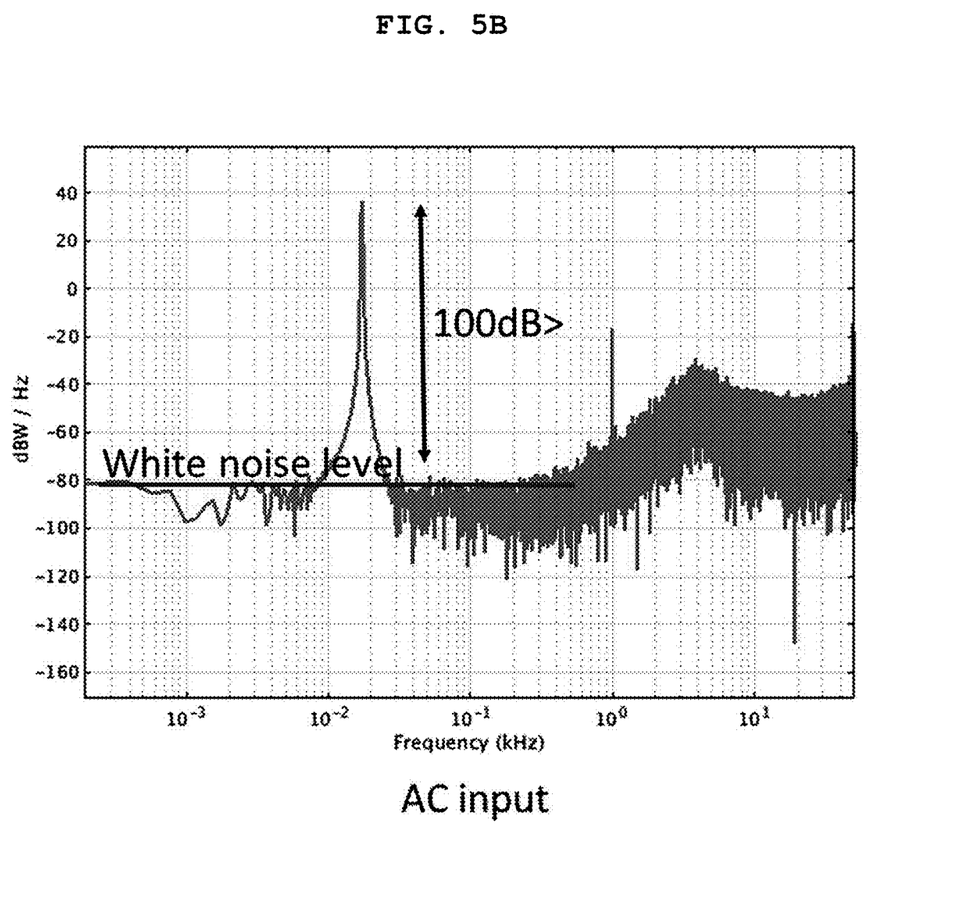

FIGS. 4A and 4B are diagrams illustrating a noise simulation model of the low power modulator 100 with the VCO quantizer according to an embodiment of the present disclosure. FIGS. 5A and 5B are diagrams showing a noise performance graph of the low power modulator 100 with the VCO quantizer according to an embodiment of the present disclosure.

Referring to FIGS. 4A and 4B, the low power modulator 100 may include a noise 401 of the DAC 150, a noise 402 of the integrator 110, a noise 403 of the quantizer 120, a quantization error 404, a truncate error 405, and a jitter error.

In this case, referring to FIGS. 5A and 5B, a wide dynamic range (DR) and a high spurious free dynamic range (SFDR) (100 dB>, $10_{pA}$ to $1_{uA}$) may be confirmed.

Further, a bandwidth (BW) of 1 to 0.5 KHz for a spike signal may be confirmed and low power consumption (to 1 uW) may be confirmed.

According to the present disclosure, as compared to an environment where existing optical microscopes are required, experiments using an IC chip may provide more excellent research convenience to biotechnologists.

The low power modulator 100 according to the present disclosure can be used for a longer time than a conventional IC chip with the same battery to increase the persistence to the activity, thereby providing further improved convenience.

Further, the low power modulator 100 according to the present disclosure may be applied to measure an electrical signal as well as a fluorescent signal using a photodiode to measure all wide input currents and can be used in various fields due to a wide application range up to measurement of power consumption of a low power system and measurement of electrical characteristics of a low power device.

The above description is only to illustratively describe the technical idea of the present disclosure, and those skilled in the art can make various modification and changes in a range without departing from the intrinsic features of the present disclosure.

Therefore, the embodiments of the present disclosure are not intended to limit the technical idea of the present disclosure, but illustrative, and the scope of the present disclosure is not limited to the embodiments.

The protective scope of the present disclosure should be construed based on the appended claims, and all technical ideas in the equivalent scope thereto should be construed as falling within the scope of the present disclosure.

What is claimed is:

1. A low power modulator with a VCO quantizer comprising:
   an integrator converting an input current to a voltage;
   a quantizer converting the converted voltage to digital information;
   a filter unit filtering the converted digital information;
   a DAC converting the filtered digital information into a feedback current; and
   a controller calculating a digital information output based on a difference value between the input current and the feedback current for each sampling time,
   wherein the filter unit comprises a digital Infinite Impulse Response (IIR) filter, and
   wherein the filter unit is configured to receive a signal of the converted digital information from the quantizer, process a first signal passing through the digital IIR filter, process a second signal without passing through the digital IIR filter, combine the first signal and the second signal to transmit the combined signal to the DAC as the digital information.

2. The low power modulator with the VCO quantizer of claim 1, further comprising:
   a PWM adjusting a bit of the DAC to 1 bit.

3. The low power modulator with the VCO quantizer of claim 1, wherein the integrator outputs a feedback voltage that accumulates the difference value between the input current and the feedback current.

4. The low power modulator with the VCO quantizer of claim 3, wherein the quantizer outputs digital information corresponding to the feedback voltage.

5. The low power modulator with the VCO quantizer of claim 3, wherein the feedback voltage is increased or decreased for each sampling time.

6. The low power modulator with the VCO quantizer of claim 5, wherein the controller calculates an average value of the digital information corresponding to the feedback voltage for each sampling time.

7. The low power modulator with the VCO quantizer of claim 3, wherein a threshold value of the converted digital information is determined based on a voltage readable by the quantizer.

8. The low power modulator with the VCO quantizer of claim 1, wherein the difference value between the input current and the feedback current is accumulated in the integrator for each sampling time, and
   the integrator outputs a feedback voltage corresponding to the accumulated feedback current.

9. The low power modulator with the VCO quantizer of claim 1, wherein the filter unit filters a low frequency bandwidth of the digital information.

* * * * *